United States Patent
Guo

(10) Patent No.: US 10,985,346 B2
(45) Date of Patent: Apr. 20, 2021

(54) OLED DISPLAY DEVICE AND MANUFACTURING METHOD THEREOF

(71) Applicant: Wuhan China Star Optoelectronics Semiconductor Display Technology Co., Ltd., Wuhan (CN)

(72) Inventor: Tianfu Guo, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 284 days.

(21) Appl. No.: 16/308,781

(22) PCT Filed: Nov. 2, 2018

(86) PCT No.: PCT/CN2018/113554
§ 371 (c)(1),
(2) Date: Dec. 10, 2018

(87) PCT Pub. No.: WO2020/052026
PCT Pub. Date: Mar. 19, 2020

(65) Prior Publication Data
US 2020/0321558 A1 Oct. 8, 2020

(30) Foreign Application Priority Data

Sep. 13, 2018 (CN) .......................... 201811065891.3

(51) Int. Cl.
*H01L 51/52* (2006.01)
*H01L 27/32* (2006.01)
(Continued)

(52) U.S. Cl.
CPC ...... *H01L 51/5275* (2013.01); *H01L 27/3244* (2013.01); *H01L 51/0097* (2013.01);
(Continued)

(58) Field of Classification Search
CPC . H01L 51/5275; H01L 51/0097; H01L 51/56; H01L 51/5262; H01L 27/3244;
(Continued)

(56) References Cited

U.S. PATENT DOCUMENTS 8,408,775 B1 * 4/2013 Coleman ............... F21V 7/04
362/615
2018/0241003 A1 8/2018 Huang
(Continued)

FOREIGN PATENT DOCUMENTS

| CN | 101231462 A | 7/2008 |
|---|---|---|
| CN | 106486523 A | 3/2017 |

(Continued)

*Primary Examiner* — Caridad Everhart
(74) *Attorney, Agent, or Firm* — Kirton McConkie; Evan R. Witt

(57) ABSTRACT

An organic light-emitting diode (OLED) display device is provided in the present invention, including a flexible substrate, a thin film transistor (TFT) layer, an OLED light emitting layer, a light extraction film layer, an inorganic protection film layer, and a packaging film layer. The light extraction film layer includes a first light extraction film layer and a second light extraction film layer. A nano-imprint process is performed on the second light extraction film layer to form a micro-lens array. The present invention also provides a manufacturing method of the OLED display device.

8 Claims, 3 Drawing Sheets

(51) Int. Cl.
*H01L 51/56* (2006.01)
*H01L 51/00* (2006.01)

(52) U.S. Cl.
CPC ........ *H01L 51/56* (2013.01); *H01L 2227/323* (2013.01); *H01L 2251/303* (2013.01); *H01L 2251/5338* (2013.01)

(58) Field of Classification Search
CPC ....... H01L 2251/5338; H01L 2251/303; H01L 2227/323; H01L 2227/326
See application file for complete search history.

(56) References Cited

U.S. PATENT DOCUMENTS

2018/0358581 A1 12/2018 Kim et al.
2019/0131568 A1* 5/2019 Li ....................... H01L 51/5284

FOREIGN PATENT DOCUMENTS

| | | |
|---|---|---|
| CN | 106784365 A | 5/2017 |
| CN | 106848100 A | 6/2017 |
| CN | 107482105 A | 12/2017 |
| CN | 108198836 A | 6/2018 |
| KR | 20180094464 A | 8/2018 |

* cited by examiner

OLED DISPLAY DEVICE AND MANUFACTURING METHOD THEREOF

1. Field of Disclosure

The present invention relates to a field of display techniques and in particular, to an organic light-emitting diode (OLED) display device and a manufacturing method thereof.

2. Description of Related Art

An organic light-emitting diode (OLED) display device is a new display device for a tablet computer. OLEDs have advantages such as being light weight, wide viewing angles, a fast response time, low temperature tolerance, and high luminous efficiency. Therefore, the OLEDs are considered as the most promising techniques in the field of display techniques. One outstanding advantage of the OLEDs is that they can be used to make a flexible screen on a flexible substrate. However, according to research, the OLEDs devices have lower light output efficiency. Hence, it is a big challenge on how to improve the light output efficiency of the OLEDs devices.

In summary, a conventional OLED display device and a manufacturing method thereof have following disadvantages. In the conventional OLED display device, an organic light emitting layer has limited luminous flux, organic layers have optical waveguide therebetween, and a substrate has poor optical coupling. As a result, brightness of the OLED display device is reduced, and thereby the light output efficiency of the OLED display device is not good.

SUMMARY

The present invention provides an organic light-emitting diode (OLED) display device and a manufacturing method thereof. The present invention effectively improves the light output efficiency of the OLED display device and solves the problems existing in a conventional OLED display device and a manufacturing method thereof. The problems of the conventional OLED display device are as follows. In the conventional OLED display device, an organic light emitting layer has limited luminous flux, organic layers have optical waveguide therebetween, and a substrate has poor optical coupling. As a result, brightness of the OLED display device is reduced, and thereby, light output efficiency of the OLED display device is not good.

In solution, the present invention provides an OLED display device. The OLED display device comprises a flexible substrate, a thin film transistor (TFT) layer disposed on the flexible substrate, an OLED light emitting layer disposed on the TFT layer, a light extraction film layer disposed on the TFT layer and the OLED light emitting layer, an inorganic protection film layer disposed on the light extraction film layer, and a packaging film layer disposed on the OLED light emitting layer and the inorganic protection film layer. The light extraction film layer includes a first light extraction film layer and a micro-lens array, the first light extraction film layer is disposed on the TFT layer, and the micro-lens array is disposed on the OLED light emitting layer.

According to one embodiment of the OLED display device of the present invention, the light extraction film layer is a plasma-polymerized hexamethyl-disiloxane soft film, and the light extraction film layer has a thickness of 1 to 2 micrometers (μm).

According to one embodiment of the OLED display device of the present invention, the micro-lens array comprises at least one micro lens, and the micro-lenses are arranged in an array.

According to one embodiment of the OLED display device of the present invention, each of the micro-lenses is of a spherical shape or an elliptic shape.

According to one embodiment of the OLED display device of the present invention, the inorganic protection film layer is zirconium dioxide or titanium dioxide, and the inorganic protection film layer has a thickness of less than 50 nanometers (nm).

According to one embodiment of the OLED display device of the present invention, the packaging film layer comprises a first inorganic packaging layer, a first organic packaging layer and a second inorganic packaging layer stacked with one another.

The present invention provides a manufacturing method of an OLED display device, comprising:

S10: providing a substrate, coating a flexible substrate on a surface of the substrate, followed by developing a TFT layer on a surface of the flexible substrate, then developing an OLED light emitting layer on a surface of the TFT layer;

S20: depositing a light extraction film layer on surfaces of the TFT layer and the OLED light emitting layer;

S30: using a particular mold to perform a nano-imprint process on the light extraction film layer on a surface of the OLED light emitting layer to form a micro-lens array;

S40: coating an inorganic protection film layer on a surface of the light extraction film layer by an atomic deposition process; and S50: depositing a packaging film layer on the OLED light emitting layer and the inorganic protection film layer and removing the substrate.

In the manufacturing method of the OLED display device according to one embodiment of the present invention, the light extraction film layer is a plasma-polymerized hexamethyl-disiloxane soft film, and the light extraction film layer has a thickness of 1 to 2 μm.

In the manufacturing method of the OLED display device according to one embodiment of the present invention, the micro-lens array comprises at least one micro-lens, the micro-lenses are arranged in an array, and each of the micro-lenses is of a spherical shape or an elliptic shape.

In the manufacturing method of the OLED display device according to one embodiment of the present invention, the inorganic protection film layer is zirconium dioxide or titanium dioxide, and the inorganic protection film layer has a thickness of less than 50 nm.

Advantages of the present invention: In the OLED display device and the manufacturing method thereof, the micro-lens array having a particular size and a particular arrangement is formed on the surface of the OLED light emitting layer through the nano-imprint process, and then the inorganic protection film layer is developed. As a result, optical coupling efficiency of the micro-lens array is improved, and thereby light output efficiency of the OLED display device is increased.

BRIEF DESCRIPTION OF DRAWINGS

In order to more clearly illustrate the embodiments of the present disclosure or related art, figures which will be described in the embodiments are briefly introduced hereinafter. It is obvious that the drawings are merely for the purposes of illustrating some embodiments of the present disclosure, a person having ordinary skill in this field can obtain other figures according to these figures without an inventive work or paying the premise.

DETAILED DESCRIPTION OF EMBODIMENTS

Embodiments of the present disclosure are described in detail with reference to the accompanying drawings as follows. Directional terms such as up/down, right/left and the like may be used for the purpose of enhancing a reader's understanding about the accompanying drawings, but are not intended to be limiting. Specifically, the terminologies in the embodiments of the present disclosure are merely for the purpose of describing certain embodiments, but not intended to limit the scope of the invention. The same reference numbers are used throughout the drawings to refer to the same or similar parts.

The present invention solves the problems existing in a conventional organic light-emitting diode (OLED) display device and a manufacturing method thereof. The conventional OLED display device has problems as follows. In the conventional OLED display device, an organic light emitting layer has limited luminous flux, organic layers have optical waveguide therebetween, and a substrate of the OLED display device has poor optical coupling. As a result, brightness of the OLED display device is reduced, and light output efficiency of the OLED display device is not good.

Figure 1:
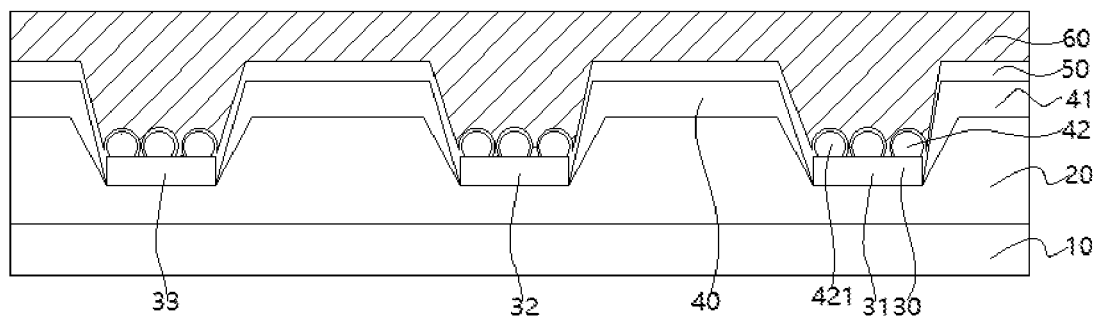
FIG. 1 is a schematic structural view showing an organic light-emitting diode (OLED) display device according to the present invention.

Please refer to FIG. 1 which is a schematic structural view showing an OLED display device of the present invention. The OLED display device comprises a flexible substrate 10, a thin film transistor (TFT) layer 20 disposed on the flexible substrate 10, an OLED light emitting layer 30 disposed on the TFT layer 20, a light extraction film layer 40 disposed on the TFT layer 20 and the OLED light emitting layer 30, an inorganic protection film layer 50 disposed on the light extraction film layer 40, and a packaging film layer 60 disposed on the OLED light emitting layer 30 and the inorganic protection film layer 50.

The OLED light emitting layer 30 comprises a blue sub-pixel light emitting area 31, a green sub-pixel light emitting area 32 and a red sub-pixel light emitting area 33. The light extraction film layer 40 includes a first light extraction film layer 41 and a micro-lens array 42, the first light extraction film layer 41 is disposed on the TFT layer 20, and the micro-lens array 42 is disposed on the OLED light emitting layer 30.

The light extraction film layer 40 is a plasma-polymerized hexamethyl-disiloxane soft film, and the light extraction film layer has a thickness of 1 to 2 micrometers (μm). The micro-lens array 42 comprises at least one micro-lens 421, and the micro-lenses 421 are arranged in an array. Each of the micro-lenses 421 is of a spherical shape. The inorganic protection film layer 50 is made of zirconium dioxide or titanium dioxide, and the inorganic protection film layer 50 has a thickness of less than 50 nanometers (nm). The packaging film layer 60 comprises a first inorganic packaging layer, a first organic packaging layer and a second inorganic packaging layer stacked with one another.

Figure 2:
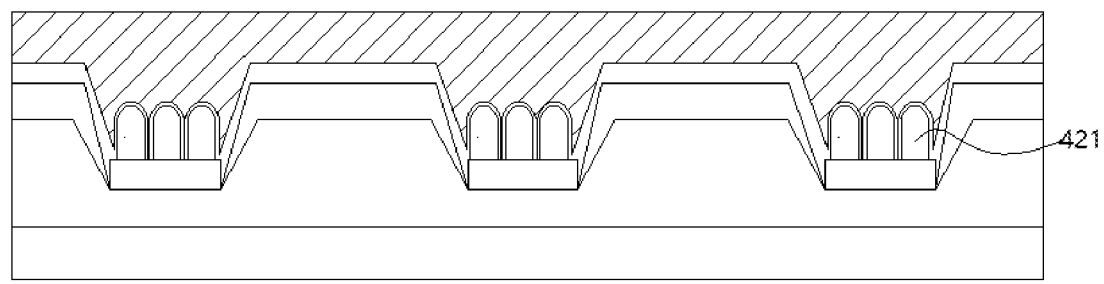
FIG. 2 is another schematic structural view showing the OLED display device according to the present invention.

FIG. 2 is another schematic structural view showing the OLED display device of the present invention. The only difference between the OLED display device of FIG. 2 and the OLED display device of FIG. 1 is that their micro-lenses are of different shape. To be specific, each of the micro-lenses 421 of FIG. 2 is of an elliptic shape.

Figure 3:
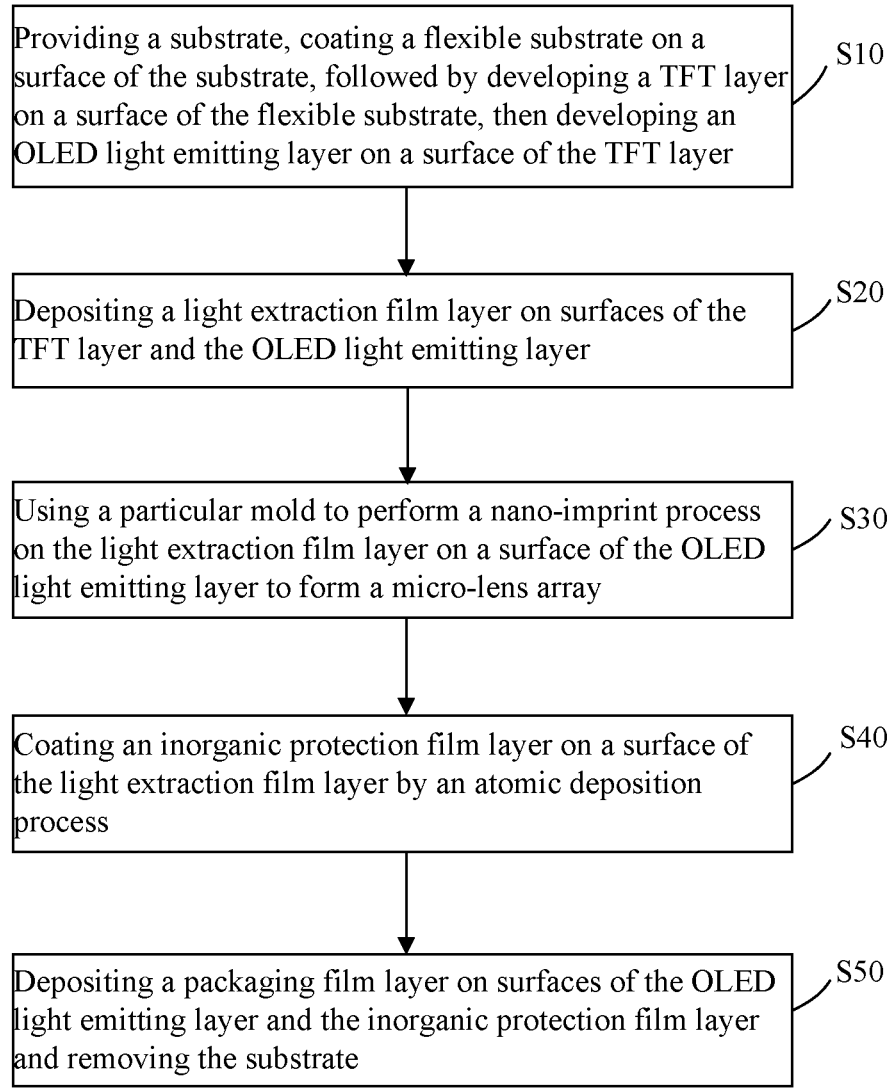
FIG. 3 is a process flow diagram showing a manufacturing method of the OLED display device.

As shown in FIG. 3, the present invention provides a manufacturing method of an OLED display device, comprising steps as follows:

S10: providing a substrate, coating a flexible substrate 10 on a surface of the substrate, followed by developing a TFT layer 20 on a surface of the flexible substrate 10, then developing an OLED light emitting layer 30 on a surface of the TFT layer.

Figure 4A:
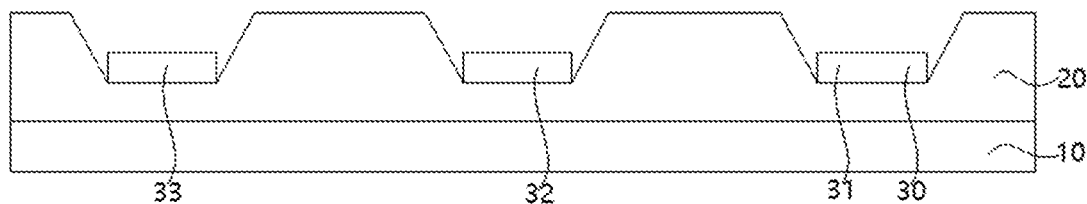
FIGS. 4A to 4E are schematic view showing the manufacturing method of the OLED display device.

In detail, Step S10 comprises:

Providing a clean glass substrate, coating the flexible substrate 10 on the glass substrate, wherein the flexible substrate 10 is made of a polyimide film or a wear-resisting transparent plastic thin film; followed by developing a TFT layer 20 on the flexible substrate 10 through a yellow-light process, wherein the TFT layer 20 is an inorganic film layer; and then developing the OLED light emitting layer 30 on the TFT layer 20 through vacuum evaporation, wherein the OLED light emitting layer 30 includes a blue sub-pixel light emitting area 31, a green sub-pixel light emitting area 32 and a red sub-pixel light emitting layer 33, as shown in FIG. 4A.

S20: depositing a light extraction film layer 40 on surfaces of the TFT layer 20 and the OLED light emitting layer 30.

Figure 4B:
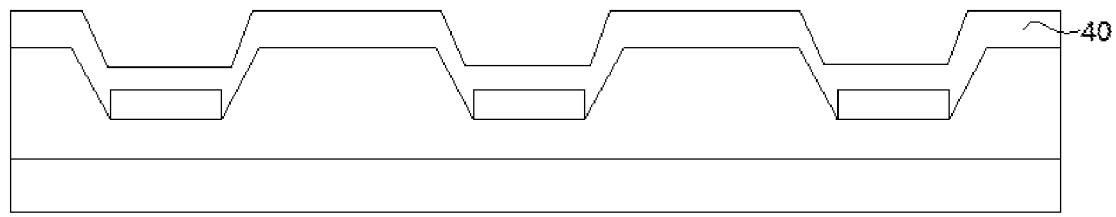

In detail, Step S20 comprises: depositing the light extraction film layer 40 on the TFT layer 20 and the OLED light emitting layer 30 through chemical vapor deposition. The light extraction film layer 40 is a plasma-polymerized hexamethyl-disiloxane soft film, and the light extraction film layer 40 has a thickness of 1 to 2 micrometers (μm), as shown in FIG. 4B.

The plasma-polymerized hexamethyl-disiloxane soft film has low hardness, softness and good plasticity, and can be manufactured through plasma-polymerized chemical vapor deposition without difficulties.

S30: using a particular mold to perform a nano-imprint process on the light extraction film layer 40 on a surface of the OLED light emitting layer 30 to form a micro-lens array 42.

Figure 4C:
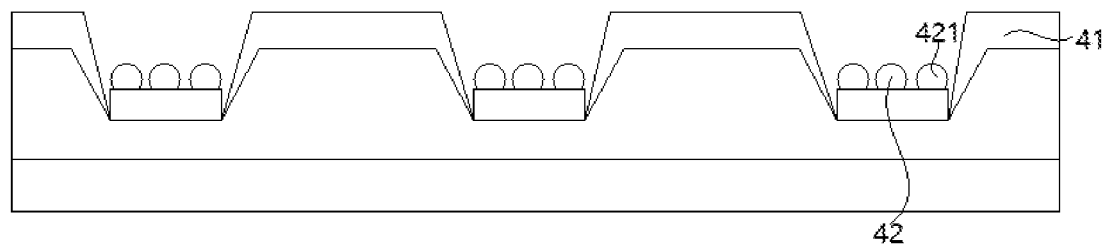
Figure 4D:
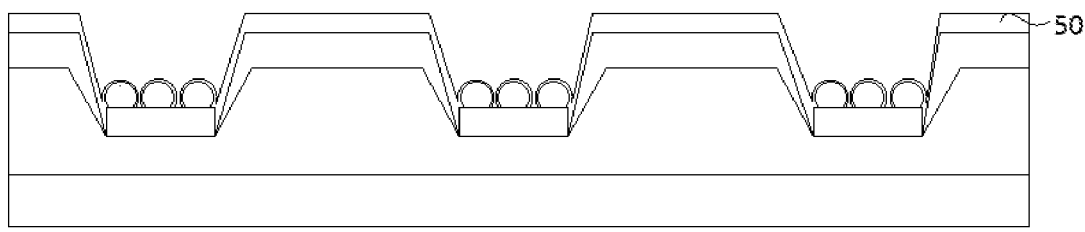

In detail, Step S30 comprises: using a particular mold to perform a nano-imprint process on the light extraction film layer 40 on a surface of the OLED light emitting layer 30 to form the micro-lens array 42. A first light extraction film layer 41 is a portion of the light extraction film layer 40 where the nano-imprint process is not performed. The micro-lens array 42 has a particular size and a particular shape. The micro-lens array 42 comprises at least one micro-lens 421, and the micro-lenses 421 are arranged in an array. Each of the micro-lenses 421 is of a spherical shape or an elliptic shape. Each of the micro-lenses 421 can have a desired size and shape by adjusting a grinding tool, as shown in FIG. 4C.

The micro-lens array 42 is disposed on a surface of the OLED light emitting layer 30. The OLED light emitting layer 30 includes a blue sub-pixel light emitting area 31, a green sub-pixel light emitting area 32 and a red sub-pixel light emitting area 33. The micro-lens array 42 on the blue sub-pixel light emitting area 31 and the micro-lens array 42 on the red sub-pixel light emitting area 33 are of different size. The size of the micro-lens array 42 can be adjusted according to respective actual light output efficiencies of the blue sub-pixel light emitting area 31, the green sub-pixel light emitting area 32 and the red sub-pixel light emitting area 33. The micro-lens array 42 is extremely close to the OLED light emitting layer 30, so light extraction efficiency is increased.

S40: coating an inorganic protection film layer 50 on a surface of the light extraction film layer 40 by an atomic deposition process.

In detail, Step S40 comprises: coating an inorganic protection film layer 50 on a surface of the light extraction film layer 40 by the atomic deposition process, wherein the inorganic protection film layer 50 is made of zirconium dioxide or titanium dioxide, the inorganic protection film layer 50 has a thickness of less than 50 nanometers (nm), and the inorganic protection film layer 50 has a high reflective index and grows along contours of the light extraction film layer 40. The inorganic protection film layer 50 can maintain the shape of the micro-lens 421 and increase a thickness of the micro-lens 421. Because inorganic protection film layer 50 has the high-reflective-index, light extraction efficiency of the light extraction film layer 40 is improved.

S50: depositing a packaging film layer 60 on surfaces of the OLED light emitting layer 30 and the inorganic protection film layer 50 and removing the substrate.

Figure 4E:
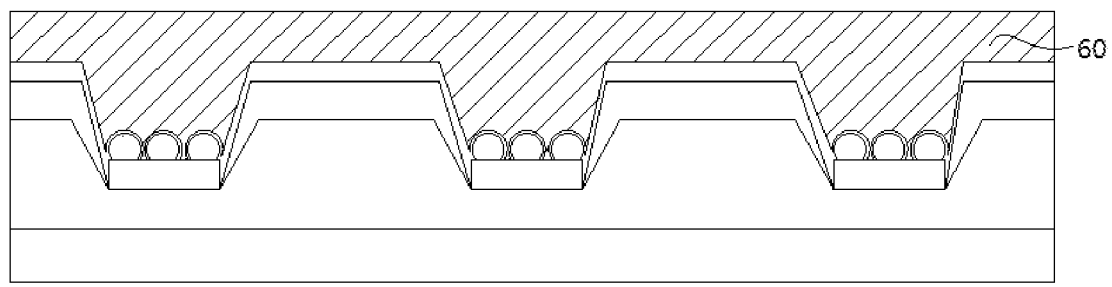

In detail, Step S50 comprises: depositing a packaging film layer 60 on surfaces of the OLED light emitting layer 30 and the inorganic protection film layer 50, and finally, removing the substrate to obtain the OLED display device, as shown in FIG. 4E; wherein the packaging film layer 60 includes a first inorganic packaging layer, a first organic packaging layer and a second inorganic packaging layer stacked with one another, the first inorganic packaging layer and the second inorganic packaging layer are both made of silicon nitride, and the organic packaging layer is made of acid ester polymer.

The method takes advantage of special material properties of the plasma-polymerized hexamethyl-disiloxane soft film manufactured through plasma-polymerized chemical vapor deposition, and utilizes nano-imprint techniques and three-dimensional (3D) growth of the atomic deposition process, and introduce the micro-lens array into the OLED display device. Therefore, the light output efficiency of the OLED display device is improved.

Advantages of the present invention: In the OLED display device and the manufacturing method thereof, a micro-lens array having a particular size and a particular arrangement is formed on the surface of the OLED light emitting layer through the nano-imprint process, and then an inorganic protection film layer is developed. As a result, optical coupling efficiency of the micro-lens array is improved, and thereby the light output efficiency of the OLED display device is increased.

It is to be understood that the above descriptions are merely the preferable embodiments of the present invention and are not intended to limit the scope of the present invention. Equivalent changes and modifications made in the spirit of the present invention are regarded as falling within the scope of the present invention.

What is claimed is:

1. An organic light-emitting diode (OLED) display device, comprising:
    a flexible substrate;
    a thin film transistor (TFT) layer disposed on the flexible substrate;
    an OLED light emitting layer disposed on the TFT layer;
    a light extraction film layer, the light extraction film layer comprising a first light extraction film layer and a micro-lens array, the first light extraction film layer disposed on the TFT layer, the micro-lens array disposed on the OLED light emitting layer;
    an inorganic protection film layer, the inorganic protection film layer disposed on a surface of the light extraction film layer; and
    a packaging film layer disposed on surfaces of the OLED light emitting layer and the inorganic protection film layer;
    wherein the light extraction film layer is a plasma-polymerized hexamethyl-disiloxane soft film, and the light extraction film layer has a thickness of 1 to 2 micrometers (μm).

2. The OLED display device according to claim 1, wherein the micro-lens array comprises at least one micro-lens, and the micro-lenses are arranged in an array.

3. The OLED display device according to claim 2, wherein each of the micro-lenses is of a spherical shape or an elliptic shape.

4. The OLED display device according to claim 1, wherein the inorganic protection film layer is zirconium dioxide or titanium dioxide, and the inorganic protection film layer has a thickness of less than 50 nanometers (nm).

5. The OLED display device according to claim 1, wherein the packaging film layer comprises a first inorganic packaging layer, a first organic packaging layer and a second inorganic packaging layer stacked with one another.

6. A manufacturing method of an OLED display device, comprising steps as follows:
    S10: providing a substrate, coating a flexible substrate on a surface of the substrate, followed by developing a TFT layer on a surface of the flexible substrate, then developing an OLED light emitting layer on a surface of the TFT layer;
    S20: depositing a light extraction film layer on surfaces of the TFT layer and the OLED light emitting layer;
    S30: performing a nano-imprint process on the light extraction film layer on a surface of the OLED light emitting layer to form a micro-lens array, wherein the light extraction film layer is a plasma-polymerized hexamethyl-disiloxane soft film, and the light extraction film layer has a thickness of 1 to 2 micrometers (μm);
    S40: coating an inorganic protection film layer on a surface of the light extraction film layer by an atomic deposition process; and
    S50: depositing a packaging film layer on surfaces of the OLED light emitting layer and the inorganic protection film layer and removing the substrate.

7. The manufacturing method of the OLED display device according to claim 6, wherein the micro-lens array comprises at least one micro-lens, the micro-lenses are arranged in an array, and each of the micro-lenses is of a spherical shape or an elliptic shape.

8. The manufacturing method of the OLED display device according to claim 6, wherein the inorganic protection film layer is zirconium dioxide or titanium dioxide, and the inorganic protection film layer has a thickness of less than 50 nanometers (nm).

* * * * *